US008171880B2

(12) United States Patent
Nishimoto

(10) Patent No.: US 8,171,880 B2
(45) Date of Patent: May 8, 2012

(54) MICROWAVE PLASMA PROCESSING APPARATUS AND METHOD OF SUPPLYING MICROWAVES USING THE APPARATUS

(75) Inventor: Shinya Nishimoto, Amagasaki (JP)

(73) Assignee: Tokyo Electron Limited (JP)

( * ) Notice: Subject to any disclaimer, the term of this patent is extended or adjusted under 35 U.S.C. 154(b) by 411 days.

(21) Appl. No.: 12/487,164

(22) Filed: Jun. 18, 2009

(65) Prior Publication Data

US 2009/0317566 A1    Dec. 24, 2009

(30) Foreign Application Priority Data

Jun. 18, 2008  (JP) ................................. 2008-159629

(51) Int. Cl.
*C23C 16/00*    (2006.01)
*C23F 1/00*    (2006.01)
*H01L 21/306*    (2006.01)

(52) U.S. Cl. ........................... 118/723 MW; 156/345.41
(58) Field of Classification Search .......... 118/723 MW; 156/345.41

See application file for complete search history.

(56) References Cited

U.S. PATENT DOCUMENTS

| 5,527,391 A * | 6/1996 | Echizen et al. ............... 118/719 |
| 6,388,632 B1 * | 5/2002 | Murakawa et al. ............. 343/770 |
| 7,469,654 B2 * | 12/2008 | Ishibashi et al. ...... 118/723 MW |
| 2002/0037653 A1 * | 3/2002 | Herchen ..................... 438/726 |
| 2005/0034815 A1 * | 2/2005 | Kasai et al. ............... 156/345.41 |
| 2006/0231208 A1 * | 10/2006 | Ohmi et al. .............. 156/345.41 |

FOREIGN PATENT DOCUMENTS

| JP | 61-116948 | 6/1986 |
| JP | 03-030421 | 2/1991 |
| JP | 9-63793 | 3/1997 |
| JP | 2000-277295 | 10/2000 |
| JP | 2001-203098 | 7/2001 |
| JP | 2003-188103 | 7/2003 |
| JP | 2003-234327 | 8/2003 |
| JP | 2004-153726 | 5/2004 |

OTHER PUBLICATIONS

Notice of Grounds of Rejection—Japanese Patent Application No. 2008-159629 issued Apr. 20, 2010.

* cited by examiner

*Primary Examiner* — Rakesh Dhingra
(74) *Attorney, Agent, or Firm* — Cantor Colburn LLP

(57) ABSTRACT

A microwave plasma processing apparatus performs plasma processing on a substrate by exciting a gas by electric field energy of microwaves emitted from a radial line slot antenna (RLSA). The microwave plasma processing apparatus includes: a processing container in which plasma processing is performed; a microwave source outputting microwaves; a rectangular waveguide transmitting the microwaves outputted from the microwave source; a coaxial converter converting a mode of the microwaves transmitted to the rectangular waveguide; a coaxial waveguide including an inner conductor slidably and electrically connected to the coaxial converter by a first contact member; the first contact member fixed to the coaxial converter and slidably contacting the inner conductor; and a first spring member absorbing displacement, which is caused by thermal expansion, of the RLSA and a member disposed above the RLSA.

13 Claims, 9 Drawing Sheets

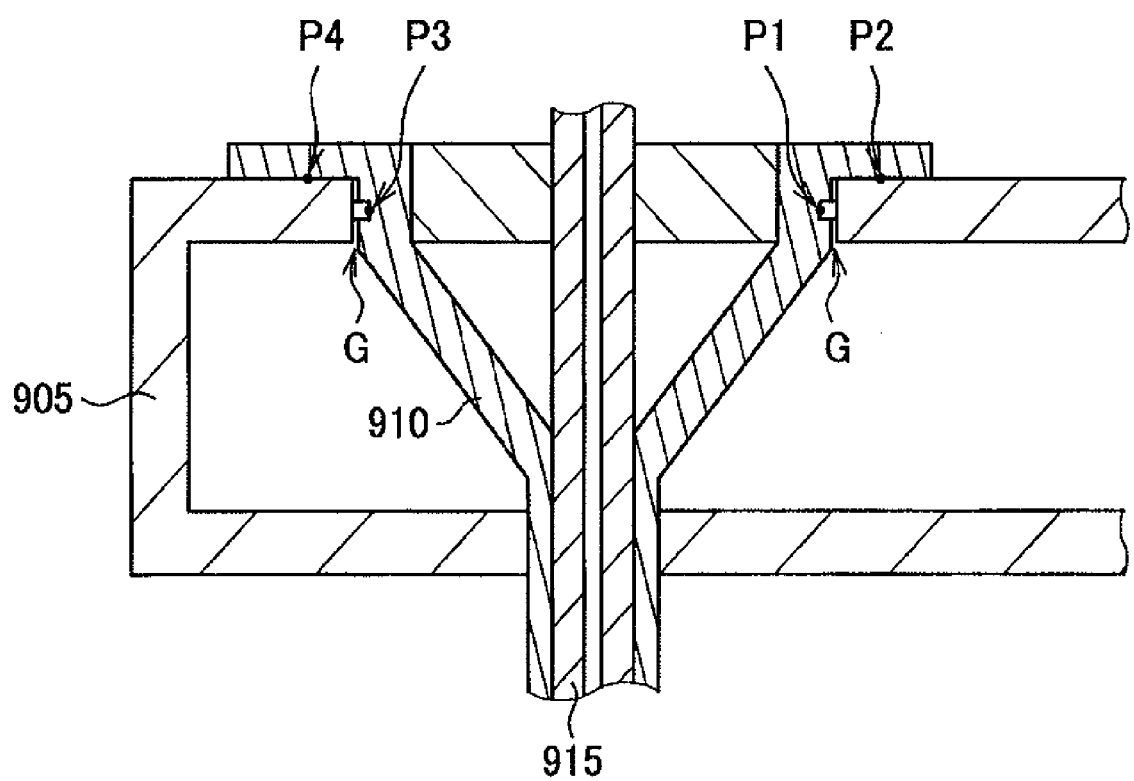

MICROWAVE PLASMA PROCESSING APPARATUS AND METHOD OF SUPPLYING MICROWAVES USING THE APPARATUS

CROSS-REFERENCE TO RELATED PATENT APPLICATIONS

This application claims the benefit of Japanese Patent Application No. 2008-159629, filed on Jun. 18, 2008, in the Japan Patent Office, the disclosure of which is incorporated herein in its entirety by reference.

BACKGROUND OF THE INVENTION

1. Field of the Invention

The present invention relates to a microwave plasma processing apparatus and a method of supplying microwaves, and more particularly, to a microwave plasma processing apparatus that performs plasma-processing on an object by exciting a gas by electric field energy of microwaves emitted from a radial line slot antenna (RLSA), and a method of supplying microwaves using the microwave plasma processing apparatus.

2. Description of the Related Art

Microwave plasma is generated by introducing microwaves into a processing container in a depressurized state and by exciting a gas by electric field energy of the introduced microwaves. In microwave plasma processing apparatuses, when an electron density of plasma is higher than a cut-off density, microwaves cannot be introduced into plasma and thus, are propagated between a dielectric plate and plasma, and some of the microwaves are absorbed into plasma and are used to sustain plasma.

According to the principle of generating plasma, since microwave plasma has a higher electron density Ne and a lower electron temperature Te than plasma that is generated by a capacitively coupled plasma or inductively coupled plasma processing apparatus, a high-quality product can be manufactured at high speed and with less damage by performing plasma processing.

As one of microwave plasma generating apparatuses, a microwave plasma processing apparatus using a radial line slot antenna (RLSA) has been proposed (e.g., see Reference 1). The RLSA is disposed on a dielectric window in a state in which, above a slot plate having a disk shape in which a plurality of slots are formed, a wavelength-shortening plate having the same shape is placed. And the middle part of the RLSA is connected to a coaxial waveguide.

In the above-described structure, microwaves of 2.45 GHz, for example, outputted from a microwave source, are propagated into the coaxial waveguide and are propagated to have a radiation shape in a radial direction of the RLSA. As such, microwaves having a high electric field strength can be radiated into the processing container via the dielectric window from the plurality of slots formed in the slot plate.

[Reference 1] Japanese Laid-Open Patent Publication No. hei 9-63793

However, during processes, the processing container is maintained at a high temperature of more than 200° C. Thus, during the processes, even though a circumferential part of an RLSA 905 is cooled by a cooling jacket 210, the temperature of the RLSA 905 increases to 150° C.-165° C., and the temperature of the cooling jacket 210 placed above the RLSA 905 increases to 80° C.-100° C., and the temperature of an outer conductor 340 increases to 40° C.-60° C., and a temperature of more than 100° C. is maintained even near the outer conductor 340 in some of the processes. As a result, the RLSA 905 and its upper members, such as the cooling jacket 210, the outer conductor 340 of the coaxial waveguide, a rectangular waveguide 305, etc., shown in FIG. 6 are thermally expanded.

Among the members, a wavelength-shortening plate 905a of the RLSA 905 is formed of a dielectric substance such as alumina ($Al_2O_3$). Meanwhile, the cooling jacket 210, the outer conductor 340, the rectangular waveguide 305, and a coaxial converter 310, placed above the RLSA 905, are formed of metal such as copper (Cu) or aluminum (Al). Compared to the linear expansion coefficient of alumina which is $7.0 \times 10^{-6}$(/° C.), the linear expansion coefficient of copper is $16.7 \times 10^{-6}$(/° C.) and the linear expansion coefficient of aluminum is $23.5 \times 10^{-6}$(/° C.), which are more than twice that of alumina. Thus, after a temperature increase, each of the cooling jacket 210, the outer conductor 340, and the rectangular waveguide 305, which are placed above the RLSA 905, is expanded and is displaced in an upper direction compared to a state before a temperature increase, as illustrated in FIG. 6.

In this case, if the coaxial converter 310 and an inner conductor 315 are integrally formed as one body, the inner conductor 315 integrally formed as one body with the coaxial converter 310 is displaced in a vertical upward direction of the processing container 100, following a displacement of the position of the rectangular waveguide 305 or the coaxial converter 310.

Meanwhile, the inner conductor 315 and the coaxial converter 310 allow a refrigerant to pass through the inner conductor 315 and are cooled even during the process. Thus, the temperature of the inner conductor 315 and the temperature of the coaxial converter 310 during the process are lower than the temperature of the outer conductor 340 and the temperature of the rectangular waveguide 305. Thus, the thermal expansion rate of the inner conductor 315 and the coaxial converter 310 during the process is lower than the thermal expansion rate of the outer conductor 340 and the rectangular waveguide 305.

As such, after a temperature increase, a taper connector 320 connected to the inner conductor 315 is displaced in an upper direction away from the RLSA 905 together with the inner conductor 315, and a gap between the taper connector 320 and the wavelength-shortening plate 905a, a gap between the wavelength-shortening plate 905a and the RLSA 905, and a gap between the wavelength-shortening plate 905a and the cooling jacket 210 vary. Thus, a transmission path of the microwaves varies, and a mode of the microwaves is unstable, and plasma becomes non-uniform. As such, the stability and reliability of the microwave plasma processing apparatus are poor.

SUMMARY OF THE INVENTION

To solve the above and/or other problems, the present invention provides a microwave plasma processing apparatus that prevents scattering of plasma by suppressing variation of a transmission path of microwaves due to thermal expansion when the microwaves are supplied into a processing container by using a radial line slot antenna (RLSA), and a method of supplying the microwaves using the microwave plasma processing apparatus.

According to an aspect of the present invention, there is provided a microwave plasma processing apparatus which performs plasma processing on an object using plasma generated by microwaves emitted from a radial line slot antenna (RLSA), the apparatus including: a processing container in which plasma processing is performed; a microwave source outputting microwaves; a rectangular waveguide transmitting the microwaves outputted from the microwave source; a coaxial converter converting a mode of the microwaves transmitted to the rectangular waveguide; and a coaxial waveguide including an inner conductor slidably and electrically connected to the coaxial converter by a first contact member, wherein the first contact member is fixed to the coaxial converter and slidably contact the inner conductor to thereby slidably and electrically connect the coxial converter and the inner conductor.

According to this, the inner conductor and the coaxial converter may be formed as separate bodies, and the inner conductor may be connected to the coaxial converter to be slidable. The first contact member may electrically connect the coaxial converter and the inner conductor each other.

According to this, after a temperature increase, members, such as the RLSA and the rectangular waveguide disposed above the RLSA, may be expanded and displaced in an upward direction. Also, even though the coaxial converter connected to the rectangular waveguide is displaced in an upward direction, the inner conductor may be connected to the coaxial converter to be slidable, and thus, the inner conductor may not be displaced together with the coaxial converter. Thus, a distance between a front end part of the inner conductor and the cooling jacket may not vary before and after a temperature increase. Also, an electrical connection between the coaxial converter and the inner conductor may be guaranteed by the first contact member. As such, variation of the transmission path of the microwaves propagated into the antenna may be prevented, and a mode of the microwaves may be stabilized, and plasma may be uniformly generated.

At least part of a front end of the inner conductor may extend along the surface of the RLSA that faces the object.

The RLSA may be held by a taper-shaped connector portion and an outer conductor of the coaxial waveguide, the taper-shaped connector portion extending from the front end of the inner conductor.

According to this clamp structure, deviation of a position of the wavelength-shortening plate and positions of internal and outer conductors (coaxial waveguide) may be prevented. As a result, variation of a transmission path of the microwaves is eliminated, and uniform plasma may be stably generated.

The processing container may include an opening in a ceiling part thereof, and wherein a dielectric window is disposed in the opening of the ceiling part, the dielectric window has a protrusion formed at the middle of the surface of the dielectric window that faces the object, and the front end of the inner conductor extends within the protrusion. As such, the mechanical strength of the apparatus may be guaranteed.

The apparatus may further include a second contact member disposed at a point at which the outer conductor of the coaxial waveguide and the taper-shaped connector portion face each other. As such, an electrical connection between the coaxial waveguide and the RLSA may be supplemented.

The apparatus may further include a first spring member disposed between a first member connected to the inner conductor and a second member connected to the coaxial converter, the first spring member absorbing displacement, which is caused by a thermal expansion, of the RLSA and a third member disposed above the RLSA. According to this, since the inner conductor is not affected by expansion of the RLSA and the member disposed above the RLSA, the position of the inner conductor may not vary before and after a temperature increase. As such, variation of the transmission path of the microwaves propagated into the RLSA may be prevented, and a mode of the microwaves may be stabilized, thus plasma may be uniformly generated.

The first spring member may be any one of a coil-shaped spring member, a thermostable metal seal, and a plate-shaped spring member (e.g., a spring washer).

The apparatus may further include a second spring member formed to be adjacent to the outer conductor of the coaxial waveguide that supports the rectangular waveguide, the second spring member providing a first force directing an inside of the processing container with respect to the outer conductor contrary to a second force by which the RLSA and the third member disposed above the RLSA are thermally expanded toward an outside of the processing container.

According to this, the second spring member may provide force directing the inside of the processing container with respect to the outer conductor contrary to thermal expansion of the outer conductor and one or more members disposed nearby the outer conductor. As such, the RLSA and the third member may absorb displacement of a vertical upward direction of the processing container due to expansion.

The second spring member may be any one of a coil-shaped spring member and a thermostable metal seal. Also, the first contact member may be a metal elastic body.

The inner conductor may be supported by a bearing, fixed to the coaxial converter, to be slidable. According to this, the inner conductor may be guided by the first contact member and the bearing. As such, a central axis of the inner conductor may be prevented from being shaked, and a distance between the edge of the inner conductor and the cooling jacket may be set as a predetermined distance as designed, thus variation of the transmission path of the microwaves may be suppressed.

The RLSA may include a conductive layer coated on an upper surface, a lower surface, and an outer circumferential surface of the wavelength-shortening plate by using plating, spraying, or metallizing, in order to use the conductive layer as a transmission path of the microwaves. Also, at a plurality of slots formed in the portion of the conductive layer formed on a lower surface of the wavelength-shortening plate, the microwaves which are propagated from the coaxial waveguide through the wavelength-shortening plate may be radiated into the processing container.

According to this, the conductive layer may be coated on the upper surface, the lower surface, and the outer circumferential surface of the wavelength-shortening plate of the RLSA by using a method such as plating, spraying, or metallizing.

If the transmission path is deformed, propagation of the microwaves may vary. However, in the above structure, the conductive layer constituting the transmission path may be closely formed to the wavelength-shortening plate and may not be deformed due to rigidity of the wavelength-shortening plate. Thus, the microwaves may be stably propagated without being affected by the state of the microwave plasma processing apparatus so that uniform plasma can be generated. Also, a gap may not exist between the wavelength-shortening plate and the conductive and thus, the conductive layer may be formed of only a high voltage-withstanding material, thus abnormal discharge may not occur.

The conductive layer may be formed by spraying Cu, Al, or Ag. In spraying, a thicker layer than in plating may be formed, and the thickness of the conductive layer may be freely controlled.

In the apparatus, the conductive layer may include a shield member so as to prevent leakage of the microwaves. According to this, for example, some of the microwaves, which normally leak from the slots through a gap between the top plate and the conductive layer, may be prevented from being leaked into the cooling jacket.

According to another aspect of the present invention, there is provided a method of supplying microwaves to a microwave plasma processing apparatus which performs plasma processing on an object using plasma generated by microwaves emitted from a radial line slot antenna (RLSA), the method including: outputting microwaves from a microwave source; transmitting the microwaves outputted from the microwave source to a rectangular waveguide; converting a mode of the microwaves by using a coaxial converter; transmitting the microwaves from the coaxial converter to the coaxial waveguide by connecting an inner conductor of a coaxial waveguide to the coaxial converter to be slidable and electrically connecting the coaxial converter and the inner conductor by using a first contact member fixed to the coaxial converter; and propagating the microwaves, transmitted to the coaxial waveguide, into the RLSA.

According to this, since the inner conductor and the coaxial converter are formed as separate bodies and the inner conductor is connected to the coaxial converter to be slidable, the inner conductor may not be displaced in an upward direction due to thermal expansion of the RLSA and the member disposed above the RLSA. Thus, a distance between the front end part of the inner conductor and the cooling jacket may not vary before and after a temperature increase. Also, an electrical connection between the coaxial converter and the inner conductor may be guaranteed by the first contact member. As such, variation of the transmission path of the microwaves propagated into the RLSA may be prevented, and a mode of the microwaves may be stabilized, and plasma may be uniformly generated.

BRIEF DESCRIPTION OF THE DRAWINGS

The above and other features and advantages of the present invention will become more apparent by describing in detail exemplary embodiments thereof with reference to the attached drawings in which:

FIGS. 4A and 4B are views of the result of simulation of distribution of electric field strengths near a gap;

DETAILED DESCRIPTION OF THE INVENTION

Figure 1:
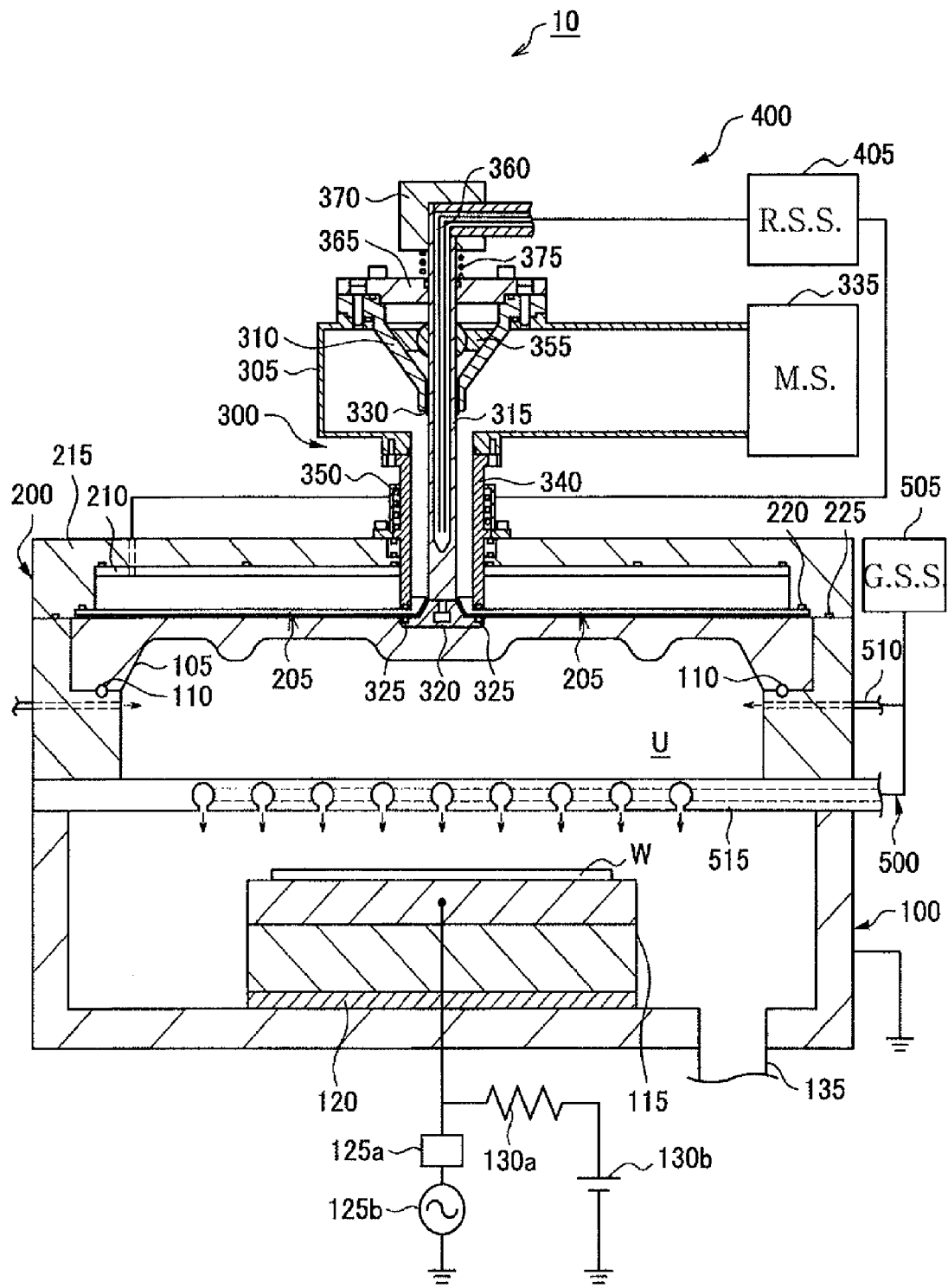
FIG. 1 is a longitudinal cross-sectional view of a microwave plasma processing apparatus according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements, thus, description thereof will be omitted.

[Entire Structure of Microwave Plasma Processing Apparatus]

FIG. 1 is a longitudinal cross-sectional view of a microwave plasma processing apparatus 10 according to an embodiment of the present invention. Referring to FIG. 1, the microwave plasma processing apparatus 10 according to the present embodiment includes a processing container 100, a cover 200, a transmission path 300, a cooling mechanism 400, and a gas supply mechanism 500.

The processing container 100 is a cylindrical container which is open at the top, and is formed of a metal such as aluminum (Al). A top plate 105 (which corresponds to a dielectric window) is disposed on the open top of the processing container 100. The top plate 105 is formed of a dielectric substance. An extension is formed in the central part of a lower surface of the top plate 105, and an intermediate part of a lower surface of the top plate 105 extends in a circumferential direction of the top plate 105. An O-ring 110 is disposed at a point at which the processing container 100 and the top plate 105 contact each other. As such, a processing chamber U is sealed.

A susceptor (holding table) 115, on which a wafer W is disposed, is installed on a bottom of the processing container 100 via an insulator 120. A high frequency power supply source 125$b$ is connected to the susceptor 115 via a matcher 125$a$, and a predetermined bias voltage is applied to the processing container 100 due to a high frequency power outputted from the high frequency power supply source 125$b$. Also, a high voltage direct current (DC) power supply source 130$b$ is connected to the susceptor 115 via a coil 130$a$, and the wafer W is electrostatically adsorbed due to a DC voltage outputted from the high voltage DC power supply source 130$b$. A vacuum pump (not shown) is attached to the processing container 100, and a gas in the processing container 100 is exhausted via a gas exhaust pipe 135, thus the processing chamber U is depressurized to a desired vacuum level.

The cover 200 includes a radial line slot antenna (RLSA) 205 (hereinafter, simply referred to as an antenna 205), a cooling jacket 210, and a microwave shielding cover 215. The antenna 205 is disposed directly on the top plate 105.

Figure 2:
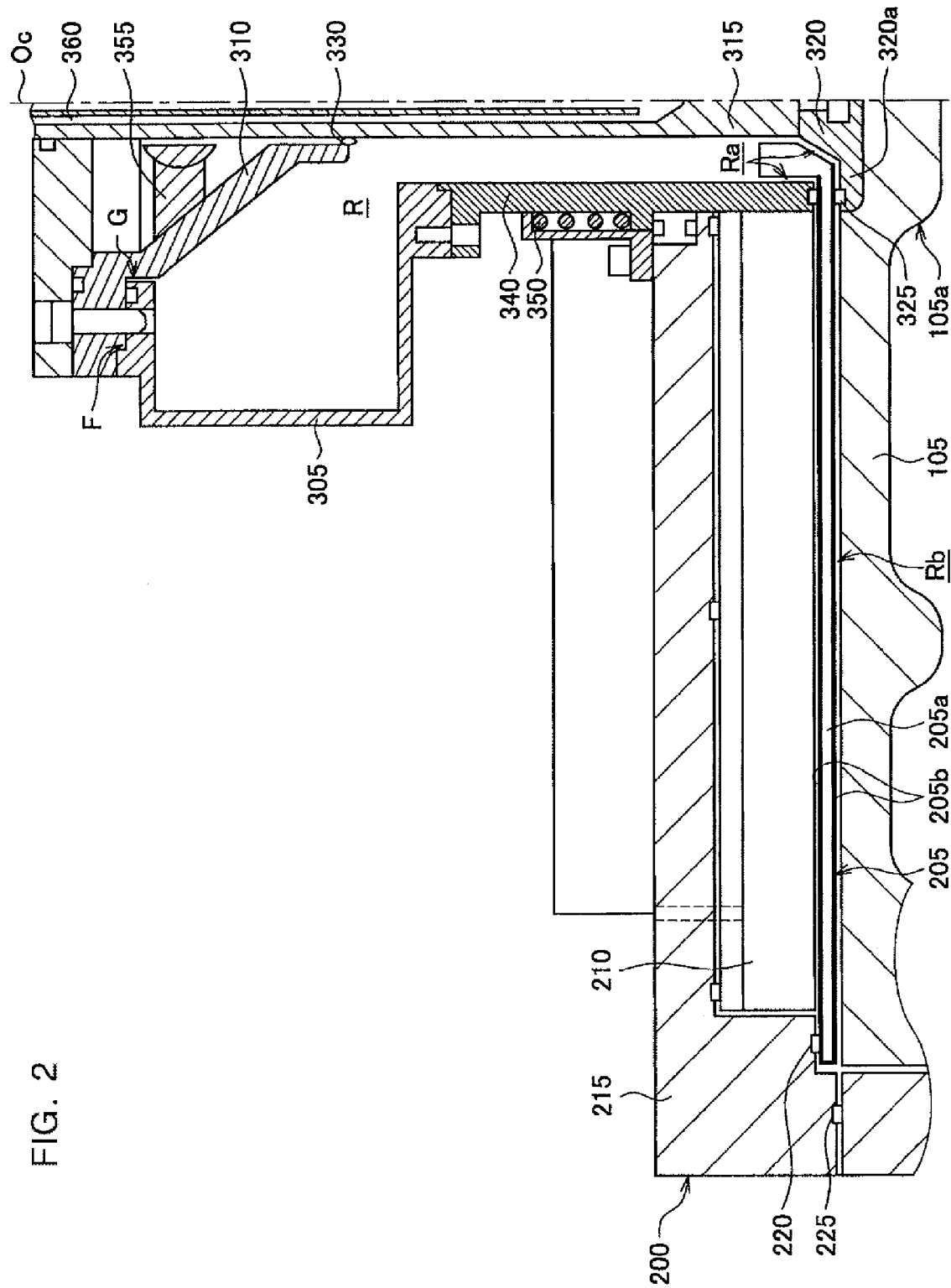
FIG. 2 is a view of a path, on which microwaves are propagated, of the microwave plasma processing apparatus of FIG. 1.

A radial line slot antenna 205 is a single flat plate which is in shape of a disk. As shown in FIG. 2 which is an enlarged longitudinal cross-sectional view of a left part of the radial line slot antenna 205, the radial line slot antenna 205 is covered with a metal layer 205$b$ on an upper surface, an outer circumferential surface, and a lower surface of a wavelength-shortening plate 205$a$ that is used as a base member. The metal layer 205$b$ is closely formed to the wavelength-shortening plate 205$a$ and is integrally formed as one body with the wavelength-shortening plate 205$a$ by using a method such as plating, spraying, or metallizing. In the present embodiment, the metal layer 205$b$ is formed by spraying and melting Al. Also, the metal layer 205$b$ may be formed by spraying a metal having a high electrical conductivity such as copper (Cu), gold (Au), or silver (Ag). Also, the metal layer 205$b$ is an example of a conductive layer, and the conductive layer is not limited to metal.

A plurality of slots St (radiation holes (not shown)) that radiate microwaves are formed in the lower surface of the wavelength-shortening plate 205$a$. The wavelength-shortening plate 205$a$ is formed of a dielectric substance such as alumina or the like. In the antenna 205, microwaves are propagated in a radial direction of the antenna 205 and through the slots St to be radiated into the processing chamber U.

The cooling jacket 210 is formed above the antenna 205 and is adjacent to the antenna 205. The cooling jacket 210 is formed of Al and adjusts the temperature near the antenna 205. The microwave shielding cover 215 covers the antenna 205 and the cooling jacket 210 so as to shield microwaves propagated into the antenna 205 so that the microwaves are not emitted outside the microwave plasma processing apparatus 10.

Shield members 220 and 225 prevent some of the microwaves, which through the slots St, from leaking from a gap between the top plate 105 and the metal layer 205b of FIG. 2 into a gap between sides of the cooling jacket 210 or a gap between the cover 200 and the processing container 100.

The transmission path 300 mainly includes a rectangular waveguide 305, a coaxial converter 310, an inner conductor 315, an outer conductor 340, a taper connector 320, and the radial line slot antenna 205. The microwaves are transmitted to a space (hereinafter, referred to as a transmission path R of the microwaves) that is defined by the transmission path 300. In this regard, the microwaves are propagated into the wavelength-shortening plate 205a and are reflected from an end face of the wavelength-shortening plate 205a, and are matched with a discharge load and an impedance of the transmission path 300 by using a tuner (not shown), and standing waves are generated in the space of the transmission path 300 due to an interference between progressive waves and reflective waves.

The rectangular waveguide 305 is connected to a microwave source 335. The coaxial converter 310 is formed to have a cone shape and converts a mode of the microwaves from the TE (Traverse Electric) mode into a mixed mode of a TE mode and a TM (Traverse Magnetic) mode. The mode-converted microwaves are transmitted to a coaxial waveguide (inner conductor 315 and outer conductor 340). The inner conductor 315 and the outer conductor 340 are formed of silver-plated copper. An upper part of the outer conductor 340 is screw-fixed to the rectangular waveguide 305. A second spring member 350 is formed on an outer circumference of the outer conductor 340. During a temperature increase, the second spring member 350 absorbs displacement of the outer conductor 340 or displacement that occurs at or near the outer conductor 340. The outer conductor 340 and the taper connector 320 hold the metal layer 205b and the wavelength-shortening plate 205a in place and prevent displacement of the radial line slot antenna 205.

The taper connector 320 is taper-shaped and is screw-fixed to the inner conductor 315 at a lower surface of the inner conductor 315. The taper connector 320 is formed of gold-plated copper. The lower surface of the taper connector 320 extends in a flange shape in a radial direction of the antenna 205 below the antenna 205. The extending portion of the taper connector 320 is buried in the top plate 105. In order to maintain mechanical strength of the microwave plasma processing apparatus 10, the taper connector 320 extends within a protrusion formed in the central part of the top plate 105.

A first contact member 330 is a finger-type metal elastic body that is brazed to an inner circumference of the coaxial converter 310 in an opening of a lower end part of the coaxial converter 310. In the above-described structure, the coaxial converter 310 and the inner conductor 315 are separated from each other, the inner conductor 315 is connected to the coaxial converter 310 to be slidable, and the coaxial converter 310 and the inner conductor 315 can be electrically connected to each other via the first contact member 330.

A bearing 355 is provided between the coaxial converter 310 and the inner conductor 315 along an outer circumference of the inner conductor 315. An end part of the bearing 355 is fixed to the coaxial converter 310 and guides the inner conductor 315 to be slidable. As such, the inner conductor 315 is prevented from being shaked in a transverse direction, and variation of a gap can be prevented.

The microwaves are propagated along a metal surface of a member that defines the transmission path R of the microwaves. In particular, in the radial line slot antenna 205, the microwaves pass through the slots, which are formed in the metal layer 205b, from the metal layer 205b constituting a transmission path, and are irradiated into the processing container 100.

If the transmission path is deformed, propagation of the microwaves varies. However, in the present embodiment, the metal layer 205b constituting the transmission path is closely formed to the wavelength-shortening plate 205a and is not deformed due to rigidity of the wavelength-shortening plate 205a. Thus, the microwaves are stably propagated without being affected by the state of the microwave plasma processing apparatus 10 so that uniform plasma can be generated. Also, the wavelength-shortening plate 205a and the metal layer 205b does not have a gap between thereof, and are formed of only a high voltage-withstanding material, thus abnormal discharge does not occur.

Also, as in the present embodiment, when the metal layer 205b is coated on the upper and lower surfaces and an outer circumferential surface of the wavelength-shortening plate 205a, the metal layer 205b that replaces a slot plate is thin and thus, shaves cannot be formed in the metal layer 205b. Also, unlike the structure of a conventional slot plate, the metal layer 205b is not a sheet material and thus cannot be screw-fixed to the taper connector 320. Also, the metal layer 205b has relatively low mechanical strength, and thus, cannot be robustly fixed by using a screw. Thus, the metal layer 205b may be sufficiently held by using a spring or the like. Thus, in the present embodiment, the metal layer 205b and the wavelength-shortening plate 205a, which are integrally formed as one body, are held from both sides by the outer conductor 340 and the taper connector 320. In the above-mentioned clamp structure, deviation of the wavelength-shortening plate 205a on which the metal layer 205b is coated, and the internal and outer conductors 315 and 340 (coaxial waveguide) can be prevented. As a result, variation of a transmission path of the microwaves is prevented, a radiation characteristic of the microwaves is maintained, and uniform plasma can be stably generated.

A second contact member 325 is disposed at the point at which the outer conductor 340 and the taper connector 320 face each other. The second contact member 325 supplements an electrical connection between the coaxial waveguide (inner conductor 315 and outer conductor 340) and the metal layer 205b by the clamp structure. In particular, the second contact member 325 is formed of a metal shield member. Thus, the reaction of the second contact member 325 is less than that of a spiral shield member, and an electrical connection between the metal layer 205b and the coaxial waveguide can be sufficiently obtained without applying an excessive load to the metal layer 205b.

Referring to FIG. 1, a refrigerant pipe 360 is inserted in the inner conductor 315. The rectangular waveguide 305 and the coaxial converter 310 are guided to a cover portion 365. The first spring member 375 is formed between a fixing member 370 (i.e., a member connected to the inner conductor 315) and the cover portion 365 (i.e., a member connected to the coaxial converter 310), and absorbs the displacement of the radial line slot antenna 205 and displacement that occurs in an upper portion of the radial line slot antenna 205 due to a temperature increase. As such, after a temperature increase, members, such as the antenna 205 and the rectangular waveguide 305 disposed above the antenna 205, are expanded and displaced in an upward direction. Also, even though the coaxial converter 310 connected to the rectangular waveguide 305 is displaced in an upward direction, since the inner conductor 315 and the coaxial converter 310 are formed as separate bodies and the inner conductor 315 is connected to the coaxial converter 310 to be slidable, the inner conductor 315 is not displaced together with the coaxial converter 310. Thus, a distance between a front end part (taper connector 320) of the inner conductor 315 and the cooling jacket 210 does not vary before and after a temperature increase. Also, an electrical connection between the coaxial converter 310 and the inner conductor 315 is guaranteed by the first contact member 330. As such, variation of the transmission path of the microwaves propagated into the radial line slot antenna 205 is prevented, and a mode of the microwaves is stabilized, and plasma can be uniformly generated.

Referring to FIG. 2, the rectangular waveguide 305 and the coaxial converter 310 have an engagement structure F in which the rectangular waveguide 305 and the coaxial converter 310 are engaged with each other toward an outer circumference of the transmission path 300 from an opening formed in the rectangular waveguide 305 so that a gap G formed between a lateral sidewall of the opening formed in the rectangular waveguide 305 and a lateral sidewall of the coaxial converter 310 that faces the rectangular waveguide 305 is within a predetermined range even in any facing position. The engagement structure F will be described in detail later.

In the cooling mechanism 400 of FIG. 1, a refrigerant supply source 405 and the refrigerant pipe 360 are connected to each other, and the refrigerant supply source 405 and the cooling jacket 210 are connected to each other. The refrigerant pipe 360 is a double pipe, and a refrigerant supplied from the refrigerant supply source 405 passes through an outside of the refrigerant pipe 360 from an inside of the refrigerant pipe 360 and is circulated, thus the temperature of the inner conductor 315 is adjusted. Also, the refrigerant supplied from the refrigerant supply source 405 is circulated in a flow path 210a of the cooling jacket 210 so that the temperature near the cooling jacket 210 is adjusted.

In the gas supply mechanism 500, a gas supply source 505 and a plurality of upper gas supply lines 510 are connected to each other, and the gas supply source 505 and a shower plate 515 are connected to each other. In the shower plate 515, a plurality of gas supply holes are uniformly formed to face the wafer W. A plasma excitation gas supplied from the gas supply source 505 is supplied in a lateral direction toward the inner space of the processing chamber U from through holes of the plurality of upper gas supply lines 510 that perforate the side wall of the processing container 100. A process gas supplied from the gas supply source 505 is supplied to the shower plate 515 in a lateral direction and then supplied in a downward direction from the plurality of gas supply holes formed in the shower plate 515 having a lattice shape.

Also, in the present embodiment, even though the inner conductor 315 and the taper connector 320 are connected to each other, the inner conductor 315 and the taper connector 320 may be integrally formed as one body so that a front end of the taper connector 320 extends in a flange shape. Also, at least part of a front end of the inner conductor 315 may extend along the surface of the radial line slot antenna 205 that faces the substrate.

As such, variation of the transmission path of the microwaves that occurs because the taper connector 320 is not firmly fixed to the inner conductor 315, such as a screw for connecting the inner conductor 315 and the taper connector 320 becoming loose, can be prevented. As a result, the microwaves can be more stably transmitted.

[Separation of the Coaxial Converter from the Inner Conductor]

In the present embodiment, the coaxial converter 310 and the inner conductor 315 are separated from each other. The reason why the coaxial converter 310 and the inner conductor 315 are separated from each other will be described by comparing a conventional apparatus in which the coaxial converter 310 and the inner conductor 315 are integrally formed as one body.

Figure 6:
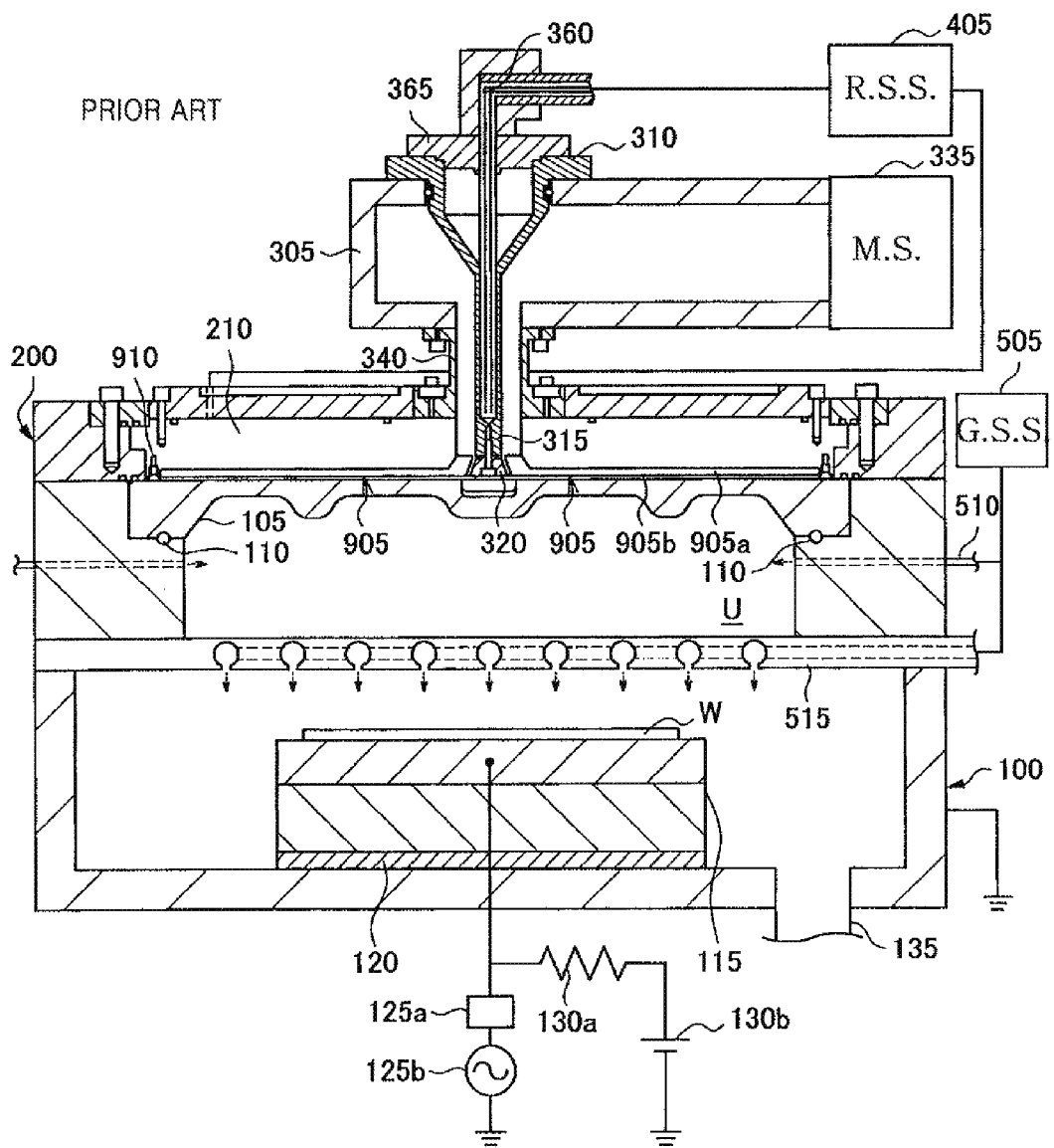
FIG. 6 is a longitudinal cross-sectional view of a conventional microwave plasma processing apparatus.
Figure 7:
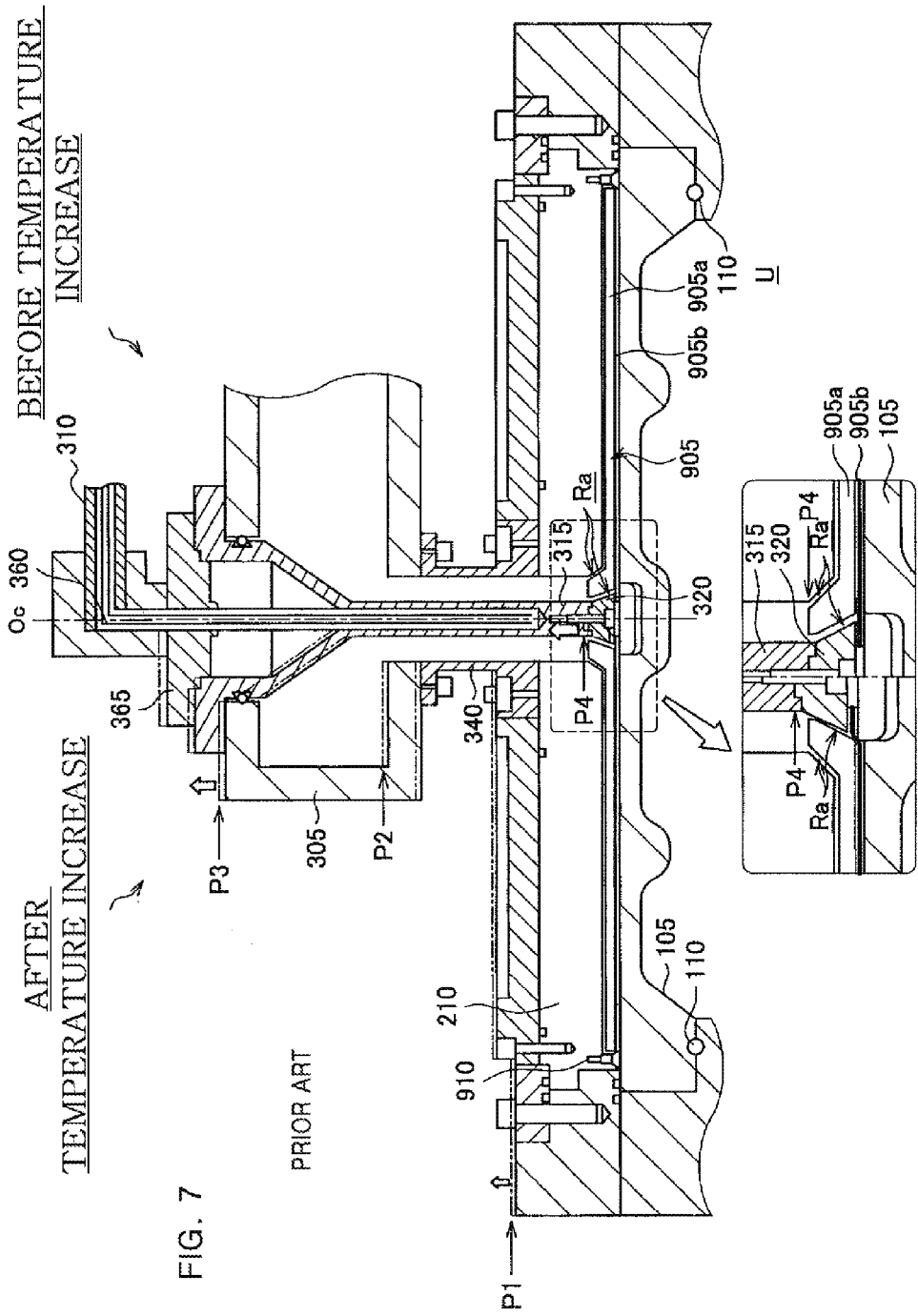
FIG. 7 is a view of a state of the conventional microwave plasma processing apparatus of FIG. 6 before and after a temperature increase.

Referring to FIGS. 6 and 7, in a conventional microwave plasma processing apparatus using an radial line slot antenna 905, a slot plate 905b is formed of a metal sheet material and is disposed to be inserted between the top plate 105 (dielectric window) disposed on a ceiling of the processing container 100 and a wavelength-shortening plate 905a, is screw-fixed to a lower surface of the taper connector 320 and is fixed to the cooling jacket 210 by a screw 910 at an outer circumference of the taper connector 320. As illustrated in the left and right sides of FIG. 7, which shows the states of the conventional microwave plasma processing apparatus after and before a temperature increase, a lower surface of the wavelength-shortening plate 905a and a lower surface of the taper connector 320 are displaced on the same plane before a temperature increase.

During processes, the processing container is maintained at a high temperature of more than 200° C. Thus, during the process, even though a circumferential part of the radial line slot antenna 905 is cooled by a cooling jacket 210, the temperature of the radial line slot antenna 905 increases to 150° C.-165° C., the temperature of the cooling jacket 210 disposed above the antenna 905 increases to 80° C.-100° C., and the temperature of an outer conductor 340 increases to 40° C.-60° C. Also, even a region near the outer conductor 340 is maintained at a temperature of more than 100° C. in some of the processes. As a result, members such as the radial line slot antenna 905, the outer conductor 340 of the coaxial waveguide, the rectangular waveguide 305, etc., are thermally expanded.

Among the members, the wavelength-shortening plate 905a of the radial line slot antenna 905 is formed of a dielectric substance such as alumina ($Al_2O_3$). Meanwhile, the cooling jacket 210, the outer conductor 340, and the rectangular waveguide 305 are formed of a metal such as copper (Cu) or aluminum (Al). Compared to the linear expansion coefficient of alumina which is $7.0 \times 10^{-6}$(/° C.), the linear expansion coefficient of Cu is $16.7 \times 10^{-6}$(/° C.) and the linear expansion coefficient of Al is $23.5 \times 10^{-6}$(/° C.), which are more than twice that of alumina. Thus, after a temperature increase, each of the cooling jacket 210, the outer conductor 340, and the rectangular waveguide 305 is respectively expanded and displaced. For example, the relationship between a displacement P1 of the cooling jacket 210, displacements P2 (lower part) and P3 (upper part) of the rectangular waveguide 305 satisfies P3>P2>P1. Displacement of each member is accumulated and thus increases in a vertical upward direction of the microwave plasma processing apparatus 10.

In this case, since the coaxial converter 310 and an inner conductor 315 are integrally formed as one body, if the rectangular waveguide 305 is displaced in an upper direction due to thermal expansion, the coaxial converter 310 and the inner conductor 315 are also displaced in an upper direction, following the displacement of the rectangular waveguide 305.

In particular, the inner conductor 315 allows a refrigerant to pass through the outside of the refrigerant pipe 360 from the inside of the refrigerant pipe 360 that is piped in a double manner in the internal space of the inner conductor 315 and thus is cooled even during the process. Thus, the temperature of the inner conductor 315 and the temperature of the coaxial converter 310 during the process are lower than the temperature of the outer conductor 340 and the temperature of the rectangular waveguide 305. Thus, the thermal expansion rate of the inner conductor 315 and the coaxial converter 310 during the process is lower than the thermal expansion rate of the outer conductor 340 and the rectangular waveguide 305.

As such, after a temperature increase, the taper connector 320 disposed at a lower end of the inner conductor 315 is displaced to be the same as that of peripheral members (P4). As a result, the taper connector 320 is displaced in an upper direction from the radial line slot antenna 905 so that a distance between the taper connector 320 and the cooling jacket 310 varies from a predetermined distance as designed. As such, the state of propagation of the microwaves varies, and a mode of the microwaves is unstable, thus uniformity of plasma is lost.

If the taper connector 320 is displaced in an upper direction from the radial line slot antenna 905, the slot plate 905b that is screw-fixed to the lower surface of the taper connector 320 is also displaced in an upper direction. As such, the transmission path of the microwaves varies due to deviation of the position of the slot plate 905b, thus plasma is non-uniformly generated.

Figure 8:
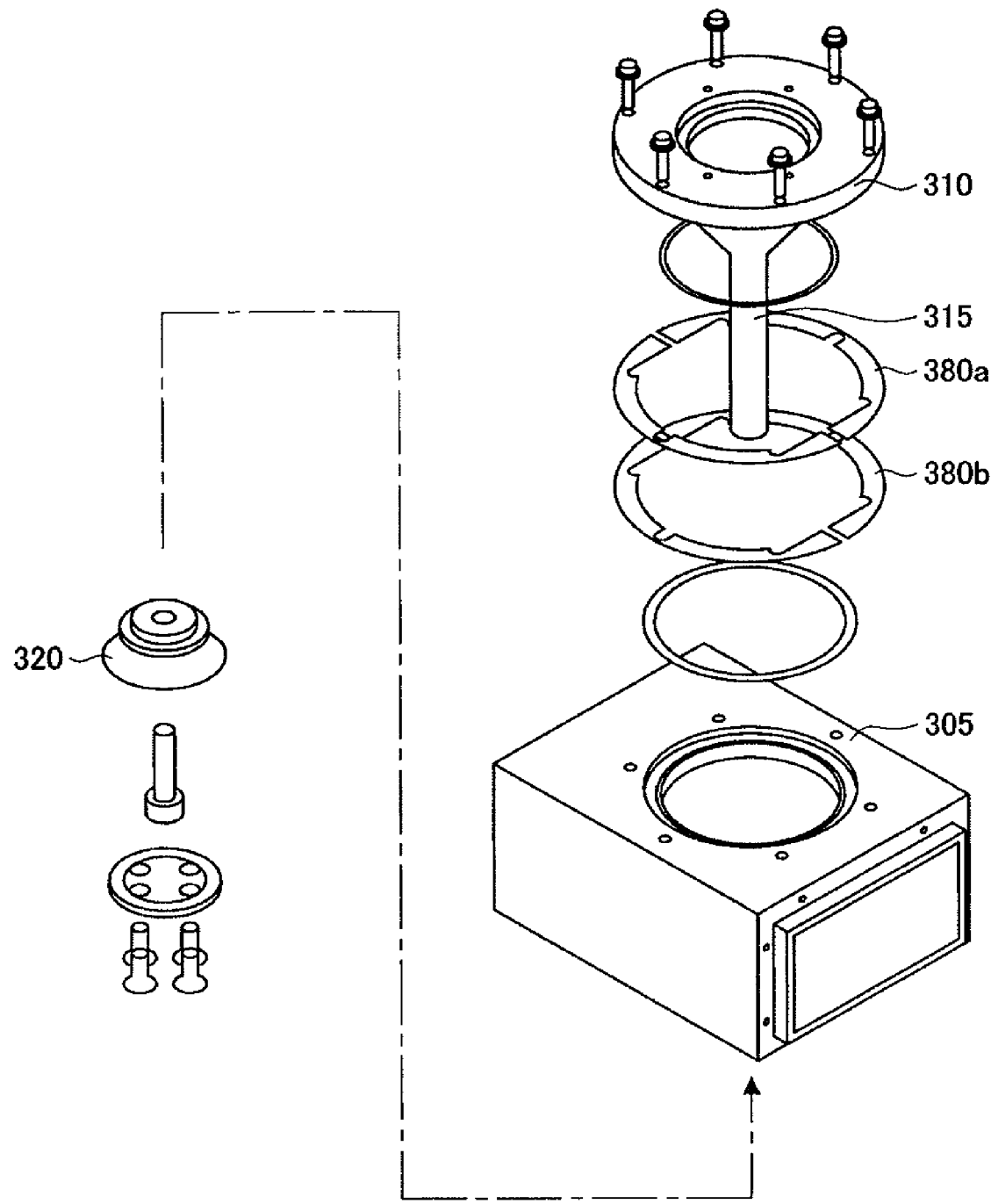
FIG. 8 is a view of level adjustment of a lower surface of a taper connector and a lower surface of a wavelength-shortening plate.

Referring to FIG. 8, each of the rectangular waveguide 305, the coaxial converter 310, and the taper connector 320 is screw-fixed and assembled, a shim 380 is engaged between the rectangular waveguide 305 and the coaxial converter 310 and level of the shim 380 is adjusted so that the lower surface of the taper connector 320 and the lower surface of the wavelength-shortening plate 205a are disposed on the same plane. For example, in FIG. 8, two shims 380a and 380b are engaged so that levels of the lower surface of the taper connector 320 and the lower surface of the wavelength-shortening plate 205a are adjusted. Due to this level adjustment, during assembly, a distance between the cooling jacket 210 disposed on the surface of the wavelength-shortening plate 205a and the taper connector 320 can be defined as a predetermined distance as designed. However, during the process, if the taper connector 320 is displaced in an upper direction in relation to the radial line slot antenna 905, fine level adjustment performed during assembly is meaningless, and as described above, the transmission path Ra of the microwaves varies.

The variation of the transmission path of the microwaves as described above causes loss of stability and reliability of the microwave plasma processing apparatus during the process. Thus, in the microwave plasma processing apparatus 10 according to the present embodiment, first, as illustrated in FIGS. 1 and 2, the coaxial converter 310 and the inner conductor 315 are separated from each other.

The inner conductor 315 is connected to the coaxial converter 310 to be slidable. The first contact member 330 for electrically connecting the coaxial converter 310 and the inner conductor 315 is formed between the coaxial converter 310 and the inner conductor 315.

Figure 3:
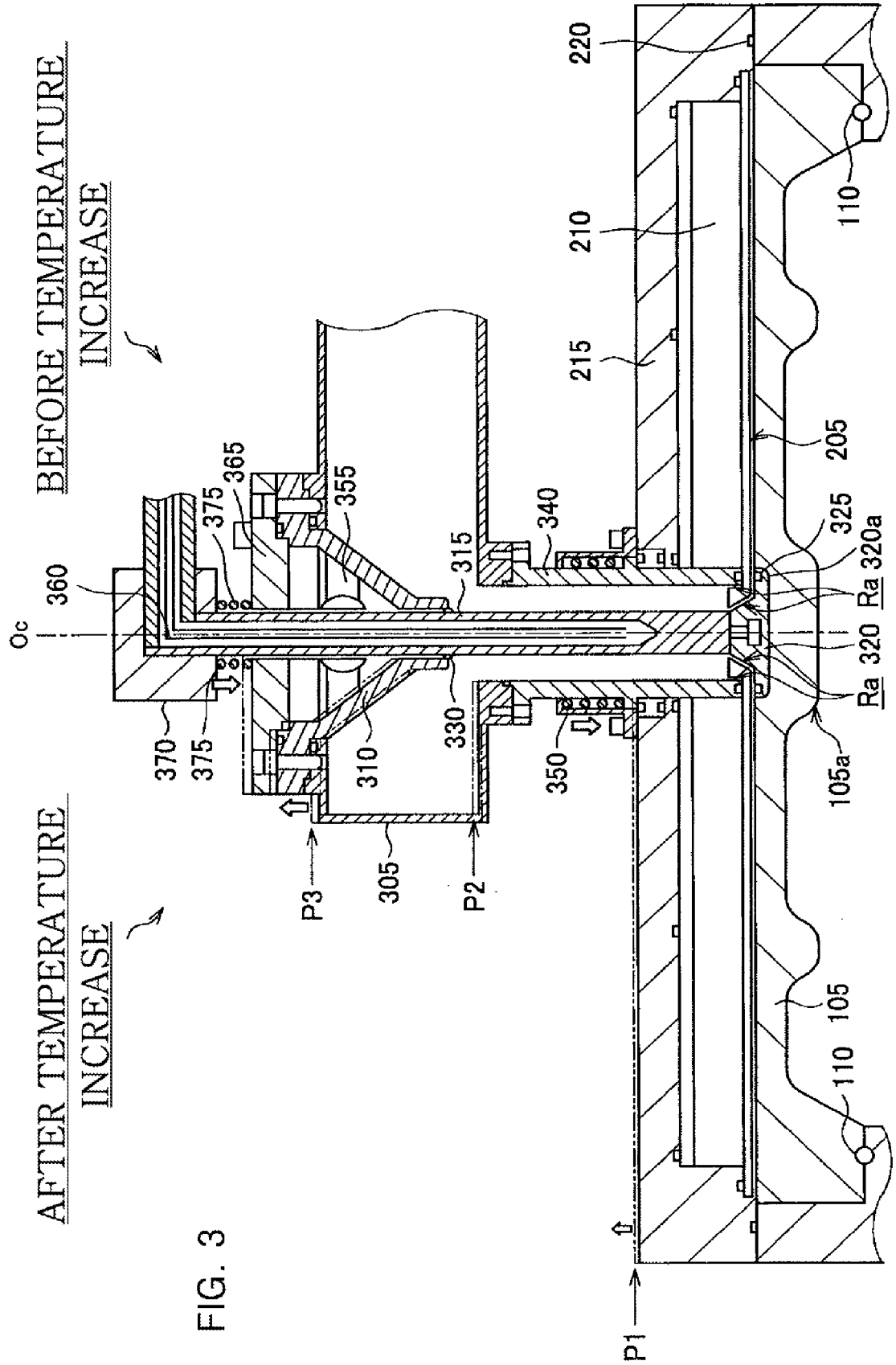
FIG. 3 is a view of a state of the microwave plasma processing apparatus of FIG. 1 before and after a temperature increase.

As such, as illustrated in FIG. 3, during the process, even though metal members such as the cooling jacket 210, the outer conductor 340, and the rectangular waveguide 305 are displaced (P1~P3) in a vertical upward direction in relation to the processing container 100, the inner conductor 315 and the coaxial converter 310 are formed as separate bodies and thus, the inner conductor 315 is not displaced due to not being affected by thermal expansion of the rectangular waveguide 305.

[First Spring Member]

In addition, the first spring member 375 is attached between a member (fixing member 370) connected to the inner conductor 315 and a member (cover portion 365) connected to the coaxial converter 310, and is contracted according to the degree of thermal expansion of the outer conductor 340 and the rectangular waveguide 305, and thus absorbs displacement in an upper direction of each member. Due to the first spring member 375, the position of the inner conductor 315 can be maintained at a position before a temperature increase, even after a temperature increase.

As such, a gap Ra (see FIG. 2) that exists between the taper connector 320 of the front end part of the inner conductor 315 and the cooling jacket 210 does not vary, and a distance between the taper connector 320 and the cooling jacket 210 is set as a predetermined distance as designed. Thus, variation of the distance between the taper connector 320 and the cooling jacket 210 can be prevented, and variation of the transmission path of the microwaves can be avoided. As such, the mode of the microwaves is stabilized so that plasma can be uniformly generated. Thus, the stability and reliability of the microwave plasma processing apparatus 10 can be improved.

[Clamp Structure]

In addition, the taper connector 320 includes an extension portion 320a disposed at an outer circumference thereof. In other words, the front end of the taper connector 320 extends from a surface, facing a wafer, of the radial line slot antenna 205 in the radial direction of the antenna 205. In the present embodiment, a flange-shaped extension is formed in the taper connector 320.

The metal layer 205b and the wavelength-shortening plate 205a may be closely formed to each other and integrally formed, and are held between the extension portion 320a of the taper connector 320 and the outer conductor 340 of the coaxial waveguide. Referring to the clamp structure, deviation of positions of the radial line slot antenna 205 and the internal and outer conductors (coaxial waveguide) can be prevented.

In addition, the extension portion 320a of the taper connector 320 is formed to extend within a diameter of the protrusion portion 105a protruding from a side of the wafer W to the wafer W in the middle of the top plate 105 formed in the opening of ceiling of the processing container 100.

Thus, the extension portion 320a of the taper connector 320 does not extend to the outside of the protrusion portion 105a formed in the central part of the top plate 105. As such, the mechanical strength of the top plate 105 can be guaranteed.

[Second Spring Member]

The second spring member 350 is formed to be adjacent to the outer conductor 340 that supports the rectangular waveguide 305, and forces the processing container 100 in the vertical downward direction with respect to the outer conductor 340 contrary to a force in which the microwave plasma processing apparatus 10 is thermally expanded in the vertical upward direction of the processing container 100.

Thus, the second spring member 350 can absorb displacement of the outer conductor 340 and a peripheral member of the outer conductor 340 in the vertical upward direction of the processing container 100. As a result, due to the first spring member 375, the second spring member 350, and the clamp structure, before and after a temperature increase, a distance between the taper connector 320 and the cooling jacket 210 is maintained as a predetermined distance as designed without varying the gap Ra, thus variation of the transmission path R of the microwaves can be prevented.

In addition, the first spring member 375 may be a coil-shaped spring member, a thermostable metal seal or plate-shaped spring member. In addition, the second spring member 350 may be a coil-shaped spring member or a thermostable metal seal.

[Prevention of Shake of Inner Conductor]

The bearing 355 that is fixed to the coaxial converter 310 and supports the inner conductor 315 to be slidable, is formed at a hollow of the coaxial converter 310. Thus, the inner conductor 315 is guided by the first contact member 330 and the bearing 355. Thus, movement of an axis Oc of the inner conductor 315 can be suppressed.

[Integrally Forming Metal Layer and Wavelength-Shortening Plate as One Body]

In the radial line slot antenna 205, the metal layer 205b is coated on an upper surface, an outer circumferential surface, and a lower surface of the wavelength-shortening plate 205a by using a method such as plating, spraying, or metallizing. The antenna 205 uses the metal layer 205b as the transmission path of the microwaves and radiates the microwaves that are propagated into the wavelength-shortening plate 205a from the coaxial waveguide, into the processing container 100 through the plurality of slots formed in the portion of the metal layer 205b formed on the lower surface of the wavelength-shortening plate 205a.

Thus, the metal layer 205b constituting the transmission path is closely formed to the wavelength-shortening plate 205a and is not deformed due to the rigidity of the wavelength-shortening plate 205a. Thus, the microwaves are stably propagated without being affected by the state of the microwave plasma processing apparatus 10 so that uniform plasma can be generated. Also, the wavelength-shortening plate 205a and the metal layer 205b does not have a gap between thereof, and are formed of only a high voltage-withstanding material, thus abnormal discharge does not occur. As a result, uniform plasma can be generated.

In addition, the metal layer 205b may be formed by spraying Cu, Al, or Ag. A thicker layer can be formed by spaying, compared to by plating, and the thickness of the metal layer 205b can be freely controlled.

[Gap G]

Figure 5:
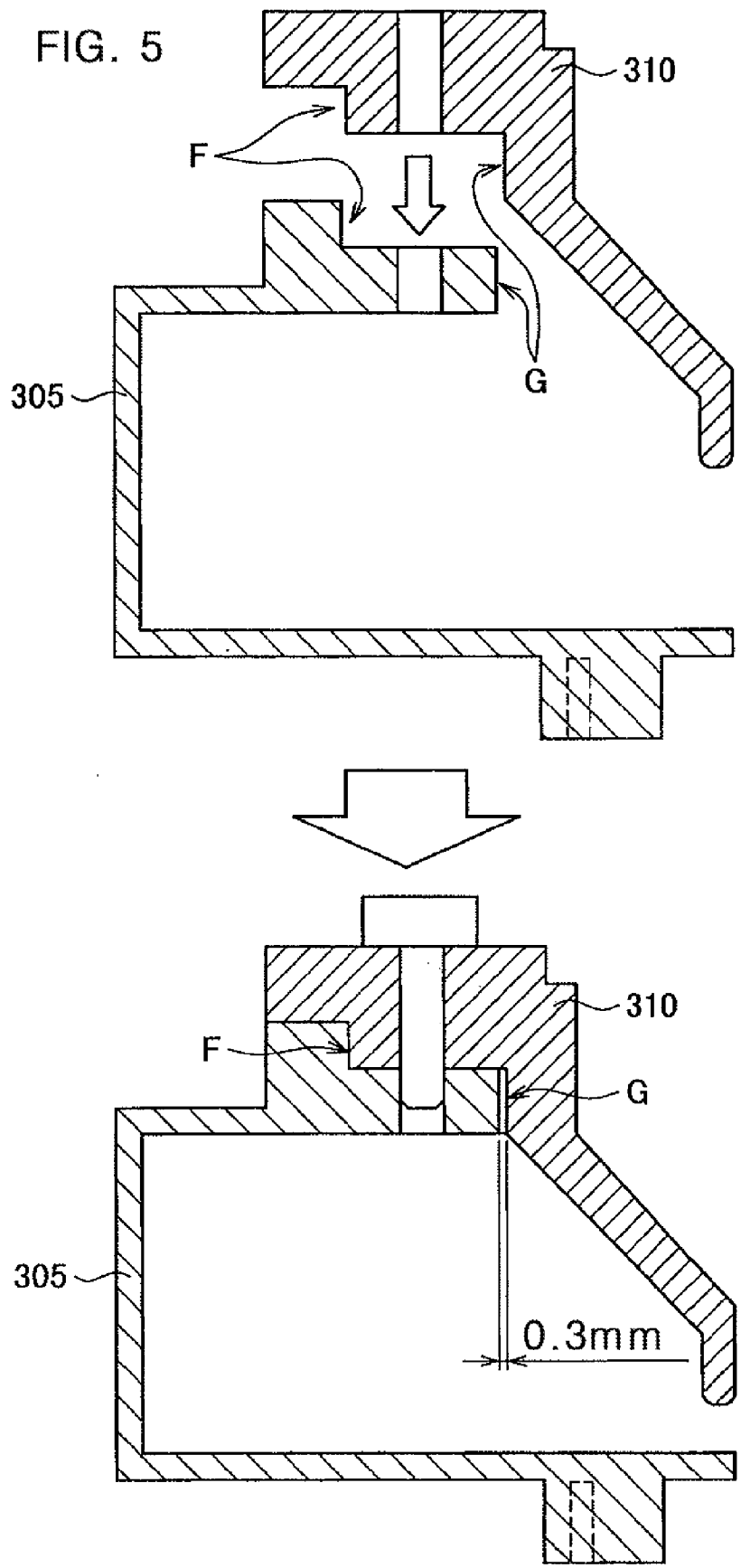
FIG. 5 is a view of an engagement structure in which a rectangular waveguide and a coaxial converter are engaged with each other.

As illustrated in FIG. 5, when the mode of the microwaves transmitted to the rectangular waveguide 305 is converted and the transmission path of the microwaves is assembled by inserting the coaxial converter 310 in the opening of the rectangular waveguide 305, due to crossing over, a gap G is formed between the lateral sidewall of the rectangular waveguide 305 and the lateral sidewall of the coaxial converter 310 that faces the lateral sidewall of the rectangular waveguide 305.

The gap G exists in a position in which the mode of the microwaves is converted from the TE mode into a mixed mode of a TE mode and a TM mode. In addition, the microwaves are reflected from a reflective end 305a of the rectangular waveguide 305 in the vicinity of the gap G and thus, the electric field of the microwaves may be scattered.

Actually, even though a distance between the reflective end 305a of the rectangular waveguide 305 and the gap G is designed as λg/2 so that node of the microwaves may be placed in the reflective end 305a and the gap G, abnormal discharge is not suppressed. Thus, in addition to setting the distance between the reflective end 305a of the rectangular waveguide 305 and the gap G, an engagement structure is formed in the rectangular waveguide 305 and the coaxial converter 310 so as to set the gap G.

[Setting of Gap]

First, in order to specifically determine a proper range of the engagement structure F and the gap G, distribution of electric field strengths of the microwaves near the gap G was obtained by simulation.

Figure 4B:
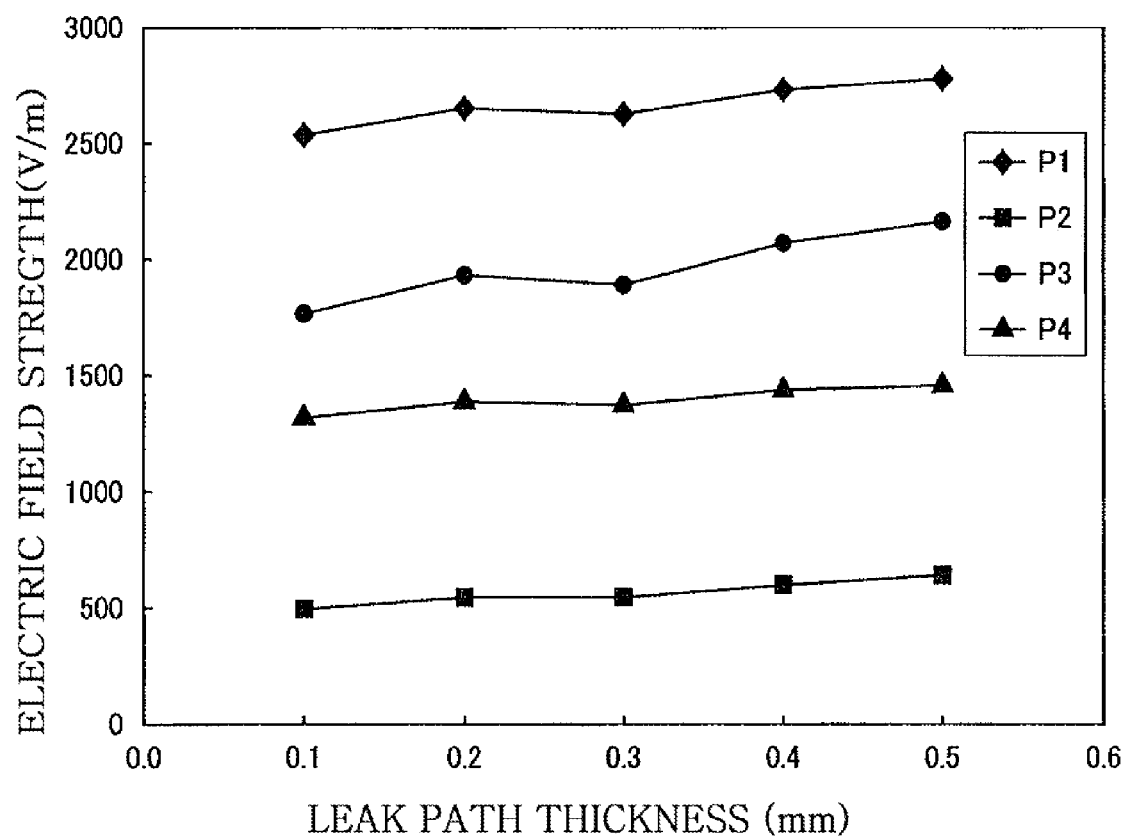

The electric field strengths at positions P1~P4 shown in FIG. 4A were calculated by simulation and the results are shown in FIG. 4B. Referring to the results, while the electric field strengths of the microwaves at the positions P1 and P3 are high, the electric field strengths of the microwaves at the positions P2 and P4 are low. In addition, as the gap (leak path thickness) G increases, electric field strengths increase. If the gap G is uniform, even if the size of the gap G varies by 0.1 mm, electric field strengths do not increase to extremes.

According to the Paschen's Law, as shown in the formula V=f(pd), a discharge firing voltage V between parallel electrodes is expressed as a product of gas pressure 'p' and a distance 'd' between the electrodes. Since pressure of gas at the gap G is an atmospheric pressure (1 atm=$1.013 \times 10^5$ Pa), as the distance d between the electrodes decreases, discharge occurs at a lower voltage V. Meanwhile, if a distance (which corresponds to the distance d) between the gaps G is non-uniform, electric field strengths are subject to be biased. Thus, the distance between the gaps G is set to be within the range of (k±n)(n≦0.1) mm with respect to a predetermined reference distance k (k≧0.3) mm so that the gap G may be set in the state where discharge does not easily occur and electric field strengths are not easily biased, and occurrence of abnormal discharge can be prevented.

Thus, even though the ring-shaped gaps G are formed in any facing position, a high-degree engagement structure F (see FIGS. 2 and 5) is formed at the rectangular waveguide 305 and the coaxial converter 310 toward an outer circumference of the transmission path 300 from the gaps G so that the gaps G are within a predetermined range. Specifically, the engagement structure F is formed by setting the reference distance k of the gaps G to 0.3 mm so that, even if the ring-shaped gaps G are formed in any facing position, the gaps G are set within a range of (k±n) mm (n≦0.1). A gap (i.e., within about 20% of a maximum of a distance difference of the gaps G) that is sufficiently smaller than the gaps G is allowed in the engagement structure F in consideration of tolerance that occurs during assembling so that any worker can easily set the gaps G within a predetermined distance difference as designed. As such, occurrence of abnormal discharge in the gaps G between the rectangular waveguide 305 and the coaxial converter 310 can be avoided.

[Coating with Insulating Material]

The rectangular waveguide 305 and the coaxial converter 310 near the gaps G are coated with an insulating material. The insulating material may be polytetrafluoroethylene (PTFE), tetrafluoroethylene-perfluoroalkylvinylether (PFA) copolymers, alumina (alumite processing, spraying), or the like. As such, a potential difference between gaps can be reduced so that occurrence of abnormal discharge can be more easily suppressed.

As described above, referring to the microwave plasma processing apparatus 10 according to the present embodiment, variation of the transmission path of the microwaves due to thermal expansion can be suppressed. As such, the stability and reliability of the microwave plasma processing apparatus 10 can be remarkably improved.

In the above embodiment, operations of the elements are related with each other and can be substituted as a series of operations in consideration of the relation. By substituting the operations of the elements in this way, the embodiment of the microwave plasma processing apparatus can be used as an embodiment of a method of supplying the microwaves using the microwave plasma processing apparatus.

While this invention has been particularly shown and described with reference to exemplary embodiments thereof, it will be understood by those skilled in the art that various changes in form and details may be made therein without departing from the spirit and scope of the invention as defined by the appended claims.

For example, the metal layer may be formed by metallizing. In this case, the metal layer such as a Mo—Mn layer formed by metallizing has a high resistance and thus, a metal layer such as an Ag—Cu—Ti layer may be used.

In addition, the above-described formation of the slot plate 905b and the wavelength-shortening plate 205a as one body (i.e., antenna 205 in which the wavelength-shortening plate 205a is coated with the metal layer 205b) or the engagement structure F may be provided in the microwave plasma processing apparatus 10 together with a structure where the coaxial converter 310 and the inner conductor 315 are separated from each other, but is not an essential condition of the present apparatus.

In addition, gas may be supplied only from the upper gas supply lines 510 or the shower plate 515. Also, instead of the gas supply mechanism 500 or in addition to the gas supply mechanism 500, a gas path is formed in the top plate 105, and the top plate 105 may be used as a shower plate.

As described above, according to the present invention, when the microwaves are supplied into the processing container 100 by using the antenna 205, variation of the transmission path of the microwaves due to thermal expansion can be suppressed, and scattering of plasma can be prevented.

What is claimed is:

1. A microwave plasma processing apparatus which performs plasma processing on an object using plasma generated by microwaves emitted from a radial line slot antenna (RLSA), the apparatus comprising:
    a processing container in which plasma processing is performed;
    a microwave source outputting microwaves;
    a rectangular waveguide transmitting the microwaves outputted from the microwave source;
    a coaxial converter converting a mode of the microwaves transmitted to the rectangular waveguide; and
    a coaxial waveguide including an inner conductor slidably and electrically connected to the coaxial converter by a first contact member;
    wherein the first contact member is fixed to the coaxial converter and slidably contacts the inner conductor to thereby slidably and electrically connect the coaxial converter and the inner conductor to each other; and
    a first spring member disposed between a fixing member fixing the inner conductor and a cover portion covering the coaxial converter, the first spring member absorbing displacement, which is caused by a thermal expansion, of the RLSA and a member disposed above the RLSA.

2. The apparatus of claim 1, wherein at least part of a front end of the inner conductor extends along the surface of the RLSA that faces the object.

3. The apparatus of claim 2, wherein the processing container comprises an opening in a ceiling part thereof, and wherein a dielectric window is disposed in the opening of the ceiling part, the dielectric window has a protrusion formed at the middle of the surface of the dielectric window that faces the object, and the front end of the inner conductor extends within the protrusion.

4. The apparatus of claim 2, wherein the RLSA is held by a taper-shaped connector portion and an outer conductor of the coaxial waveguide, the taper-shaped connector portion extending from the front end of the inner conductor.

5. The apparatus of claim 4, further comprising a second contact member disposed at a point at which the outer conductor of the coaxial waveguide and the taper-shaped connector portion face each other.

6. The apparatus of claim 1, wherein the first spring member is any one of a coil-shaped spring member, a thermostable metal seal, and a plate-shaped spring member.

7. The apparatus of claim 1, further comprising a second spring member formed to be adjacent to an outer conductor of the coaxial waveguide that supports the rectangular waveguide, the second spring member providing a first force directing an inside of the processing container with respect to the outer conductor contrary to a second force by which the RLSA and the member disposed above the RLSA are thermally expanded toward an outside of the processing container.

8. The apparatus of claim 7, wherein the second spring member is any one of a coil-shaped spring member and a thermostable metal seal.

9. The apparatus of claim 1, wherein the first contact member is a metal elastic body.

10. The apparatus of claim 1, wherein the inner conductor is supported by a bearing, fixed to the coaxial converter, to be slidable.

11. The apparatus of claim 1, wherein the RLSA comprises a conductive layer coated on an upper surface, a lower surface, and an outer circumferential surface of the wavelength-shortening plate by using plating, spraying, or metallizing, in order to use the conductive layer as a transmission path of the microwaves, and
    wherein, at a plurality of slots formed in the portion of the conductive layer formed on a lower surface of the wavelength-shortening plate, the microwaves which are propagated from the coaxial waveguide through the wavelength-shortening plate is radiated into the processing container.

12. The apparatus of claim 11, wherein the conductive layer is formed by spraying any one of Cu, Al, and Ag.

13. The apparatus of claim 11, wherein the conductive layer comprises a shield member so as to prevent leakage of the microwaves.

* * * * *